United States Patent
Fuderer et al.

(10) Patent No.: US 10,955,508 B2
(45) Date of Patent: Mar. 23, 2021

(54) B0-CORRECTED SENSITIVITY ENCODING MAGNETIC RESONANCE IMAGING

(71) Applicant: KONINKLIJKE PHILIPS N.V., Eindhoven (NL)

(72) Inventors: Miha Fuderer, Eindhoven (NL); Elwin De Weerdt, Tilburg (NL); Jean-Pierre Franciscus Alexander Maria Ermes, Son en Breugel (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 16/326,398

(22) PCT Filed: Aug. 22, 2017

(86) PCT No.: PCT/EP2017/071075
§ 371 (c)(1),
(2) Date: Feb. 19, 2019

(87) PCT Pub. No.: WO2018/036986
PCT Pub. Date: Mar. 1, 2018

(65) Prior Publication Data
US 2019/0227138 A1    Jul. 25, 2019

(30) Foreign Application Priority Data
Aug. 25, 2016  (EP) .................................. 16185766

(51) Int. Cl.
*G01R 33/561*  (2006.01)
*G01R 33/565*  (2006.01)

(52) U.S. Cl.
CPC ...... *G01R 33/5612* (2013.01); *G01R 33/5611* (2013.01); *G01R 33/56536* (2013.01); *G01R 33/56554* (2013.01); *G01R 33/56563* (2013.01)

(58) Field of Classification Search
CPC ............ G01R 33/5611; G01R 33/5612; G01R 33/56536; G01R 33/56554; G01R 33/56563
(Continued)

(56) References Cited

U.S. PATENT DOCUMENTS

| 7,042,217 B2 | 5/2006 | Zwanenburg et al. |
| 2002/0057086 A1* | 5/2002 | Mueller ............. G01R 33/54 324/307 |

(Continued)

OTHER PUBLICATIONS

Techavipoo et al "Phase Labeling Using Sensitivity Encoding (PLUS) Data Acquistion and Image Reconstruction for Geometric Distortion Correction in EPI" Magnetic Resonance in Med. vol. 61, p. 650-658 (2009).
(Continued)

*Primary Examiner* — Steven L Yeninas

(57) ABSTRACT

A magnetic resonance imaging system (200, 300, 400) includes a radio-frequency system (216, 214) with multiple coil elements (214) for acquiring magnetic resonance data (264) and a memory (250) for storing machine executable instructions (260) and pulse sequence commands (262). The pulse sequence commands are configured for controlling the magnetic resonance imaging system to acquire the magnetic resonance data according to a SENSE imaging protocol. Execution of the machine executable instructions causes a processor (244) to: control (500) the magnetic resonance imaging system to acquire the magnetic resonance data using the pulse sequence commands; reconstruct (502) a set of folded magnetic resonance images (266) from the magnetic resonance data; calculate (504) a voxel deformation map (270) from a magnetic field inhomogeneity map; and calculate (506) a set of unfolding matrices (274) using a least partially a coil sensitivity matrix (272) for the multiple coil elements, wherein the set of unfolding matrices includes at
(Continued)

least one modified unfolding matrix which is calculated at least partially using the a coil sensitivity matrix and the voxel deformation map. Undistorted magnetic resonance image data (276) is calculated (508) using the set of folded magnetic resonance images and the set of unfolding matrices.

14 Claims, 6 Drawing Sheets

(58) Field of Classification Search
USPC .......................................................... 324/309
See application file for complete search history.

(56) References Cited

U.S. PATENT DOCUMENTS

| | | | |
|---|---|---|---|
| 2010/0102819 A1 | 4/2010 | Zaitsev et al. | |
| 2011/0260726 A1 | 10/2011 | Techavipoo et al. | |
| 2012/0001633 A1* | 1/2012 | Fuderer .............. | G01R 33/5611 |
| | | | 324/309 |
| 2013/0249553 A1* | 9/2013 | Simonetti ............ | G01R 33/543 |
| | | | 324/309 |
| 2014/0361770 A1 | 12/2014 | Dannels | |
| 2015/0241537 A1 | 8/2015 | Dannels | |
| 2015/0253406 A1* | 9/2015 | Nehrke ................. | G01R 33/36 |
| | | | 324/309 |
| 2015/0362576 A1* | 12/2015 | Jurrissen .............. | G01R 33/445 |
| | | | 324/309 |
| 2016/0097831 A1 | 4/2016 | Dannels et al. | |
| 2016/0124064 A1 | 5/2016 | De Weerdt et al. | |
| 2019/0101603 A1* | 4/2019 | Zhang .............. | G01R 33/56366 |
| 2019/0277934 A1* | 9/2019 | Peeters .............. | G01R 33/5611 |

OTHER PUBLICATIONS

Yang et al "Reduction of Magnetic Field Inhomogeneity Artifacts in Echo Planar Imaging With Sense and Gesepi At High Field" Magnetic Resonance in Medicine, vol. 52, p. 1418-1423 (2004).
Pruessmann et al "Sense: Sensitivity Encoding for Fast MRI" Magn. Reson. Med. 42 p. 952-962 (1999).
Fuderer et al "Sense Reconstruction Using Feed Forward Regularization" Proc. ISMRM 11 (2004) p. 2130.
Barmet et al "Sensitivity Encoding and BO-Inhomgeneity a Simultaneous Reconstruction Approach" ISMRM (2005).
Matakos et al "Joint Estimation of Image and Field Map in Parallel MRI Using Single-Shot Acquisitions" Biomedical Imaging: From Nano-To-Macro 2010 IEEE International Symposium on IEEE Apr. 14, 2010 p. 9884-987.
Trzasko et al "Swirls 3D CE-MRA With Field Corrected Sparse Sense Reconstruction" Proceedings of the International Society for Magnetic Resonance in Medicine, ISMRM, 21st Annual Meeting Apr. 7, 2013 p. 3810.

* cited by examiner

B0-CORRECTED SENSITIVITY ENCODING MAGNETIC RESONANCE IMAGING

CROSS REFERENCE TO RELATED APPLICATIONS

This application is a U.S. national phase application of International Application No. PCT/EP2017/071075 filed on Aug. 22, 2017, which claims the benefit of EP Application Serial No. 16185766.9 filed on Aug. 25, 2016 and is incorporated herein by reference.

TECHNICAL FIELD

The invention relates to magnetic resonance imaging, in particular to Sensitivity Encoding (SENSE) magnetic resonance imaging techniques.

BACKGROUND OF THE INVENTION

A large static magnetic field is used by Magnetic Resonance Imaging (MRI) scanners to align the nuclear spins of atoms as part of the procedure for producing images within the body of a patient. This large static magnetic field is referred to as the B0 field or the main magnetic field.

One method of spatially encoding is to use magnetic field gradient coils. Typically there are three coils which are used to generate three different gradient magnetic fields in three different orthogonal directions.

During an MRI scan, Radio Frequency (RF) pulses generated by one or more transmitter coils cause a called B1 field. Additionally applied gradient fields and the B1 field do cause perturbations to the effective local magnetic field. RF signals are then emitted by the nuclear spins and detected by one or more receiver coils. Data can be acquired separately by the individual receiver coils. Images reconstructed from data for each of the individual receiver coils can be combined into a single image or image data using SENSitivity Encoding (SENSE) magnetic resonance imaging techniques. SENSE magnetic resonance imaging techniques are reviewed in the Journal article Pruessmann et. al., (1999), "SENSE: Sensitivity encoding for fast MRI," Magn. Reson. Med., 42: 952-962, doi:10.1002/(SICI)1522-2594(199911)42:5<952::AID-MRM16>3.0.CO;2-S.

The conference abstract Fuderer et. al., "SENSE Reconstruction using Feed Forward Regularization," Proc. ISMRM 11 (2004), p. 2130 discloses a method of solving the SENSE equations that provides a "feed forward" formulation of the SENSE reconstruction that can be calculated before the MRI scan takes place. The formulation of the SENSE equation includes a regularization term R.

United States patent application US 2016/0097831 A1 discloses an MRI system that includes an MRI sequence controller and an MRI system controller. Serving as a pre-scan unit, the MRI sequence controller performs a pre-scan for acquiring a sensitivity distribution of a coil. Serving as a main scan unit, the MRI sequence controller performs a main scan for acquiring signals of a magnetic resonance image. Serving as a corrector, the MRI system controller corrects the sensitivity distribution in accordance with a distortion that is contained in the magnetic resonance image and that results from the performing of the main scan. Serving as a generator, the MRI system controller generates an output magnetic resonance image using the corrected sensitivity distribution.

The ISMRM-2005 abstract '*Sensitivity encoding and B0-inhomogeneity—A simultaneous reconstruction approach*' by C. Barmet and K. P. Pruessmann addresses the problem of $B_0$-artefacts in parallel imaging and takes account toe the $B_0$-induced frequency offset.

SUMMARY OF THE INVENTION

During a SENSE MRI imaging, magnetic resonance data (which may be also referred to as magnetic resonance imaging data) is acquired using multiple coil elements. The magnetic resonance data is used to create an image for each of the multiple coil elements. As described in the above mentioned review article by Pruessmann et. al., the images are acquired using a reduced field of view in comparison to the final reconstructed image. This use of reduced field of view accelerates the acquisition, but leads to so called image folding. The images for the each of the multiple coil elements are therefore referred to as a set of folded images.

The set of folded images can be combined, without the folding artifacts, by using spatial sensitivities of the multiple coil elements. The coil sensitivities are used to calculate an unfolding matrix that correctly combines the images from the multiple coil elements. A difficulty is that the unfolding process only deals with folding artifacts that are due to the reduced field of view.

Inhomogeneities of the main magnetic field, also referred to as the $B_0$ field or $B_0$ magnetic field, can result in a shift between the true location of a voxel and its representation in a magnetic resonance image. This is particularly true inin directions in which sensitivity encoding is used. Inhomogeneities in the $B_0$ field result in a phase error that builds up over the duration of a pulse repetition. When the image is reconstructed this phase error results in an error in the location of spins that produced an MR signal. For lower $B_0$ field distortions this results in a shift or distortion in the image. If the inhomogeneities in the magnetic field are great enough several locations can be mapped to the same location in an image, and this results in artifacts that resemble the folding artifacts due to the reduced field of view in SENSE MRI imaging. For both larger and smaller $B_0$ field distortions, the standard SENSE reconstruction will result in an improperly reconstructed SENSE MRI image.

Embodiments of the invention may reduce or eliminated the effect magnetic field inhomogeneities on SENSE reconstructions by using a modified SENSE imaging technique that modifies at least one of a set of unfolding matrices with a voxel deformation map. The voxel deformation map is calculated at least partially from a magnetic field inhomogeneity map. The use of such a correction not only corrects for distortions in the in the images, but it may also have the side effect of correcting errors in the coil sensitivities due to inhomogeneities in the B0 magnetic field also.

In one aspect the invention provides for a magnetic resonance imaging system comprising a radio-frequency system comprising multiple coil elements for acquiring magnetic resonance data. The multiple coil elements may be configured for acquiring magnetic resonance data separately. In other words the multiple coil elements may be configured such that they are configured for independently receiving radio signals. The magnetic resonance imaging system further comprises a memory for storing machine-executable instructions and pulse sequence commands. Pulse sequence commands as used herein encompass commands which are used for controlling the magnetic resonance imaging system to acquire magnetic resonance data.

The pulse sequence commands may be in the form of instructions which are directly executable by portions of the magnetic resonance imaging system or they may be in the form of data such as a timing sequence which may be compiled or converted into such instructions for directly controlling components of the magnetic resonance imaging system. The pulse sequence commands are configured for controlling the magnetic resonance imaging system to acquire magnetic resonance data according to a SENSE imaging protocol. SENSE is an acronym for Sensitivity Encoding and describes a magnetic resonance imaging technique where the magnetic resonance data is acquired by an array of multiple receiver coils or elements.

The magnetic resonance imaging system further comprises a processor for controlling the magnetic resonance imaging system. Execution of the machine-executable instructions causes the processor to control the magnetic resonance imaging system to acquire the magnetic resonance data using the pulse sequence commands. Execution of the machine-executable instructions further cause the processor to reconstruct a set of folded magnetic resonance images from the magnetic resonance data. The magnetic resonance data may be acquired as portions which are acquired for each of the individual coil elements. A folded magnetic resonance image may be constructed for each of the multiple coil elements that acquired magnetic resonance data. In the SENSE imaging protocol this set of folded magnetic resonance images is then combined into a single magnetic resonance image or magnetic resonance data.

Execution of the machine-executable instructions further cause the processor to calculate a voxel deformation map from a magnetic field inhomogeneity map. The magnetic field inhomogeneity map may for instance be descriptive of magnetic field inhomogeneities of the magnetic resonance imaging system. It may also be specific to when a particular subject is within the main magnetic field of the magnetic resonance imaging system. For example a subject may have tissue or implants which causes a deformation of the magnetic field within the magnetic resonance imaging system. This deformation of the magnetic field within the magnetic resonance imaging system may cause the location of voxels to be distorted from the true geometric location. The voxel deformation map is calculated directly from the magnetic field inhomogeneity map and may be used to represent deformations which are caused by magnetic field inhomogeneities.

Execution of the machine-executable instructions further cause the processor to calculate a set of unfolding matrices using at least partially a coil sensitivity matrix for the multiple coil elements. The coil sensitivity matrix is also described in Pruessmann et al. The coil sensitivity matrix is descriptive of how voxels or a group of voxels from the various images of the set of folded magnetic resonance images is combined into a single image or set of magnetic resonance data. The set of unfolding matrices comprises at least one modified unfolding matrix. The at least one modified unfolding matrix is calculated at least partially using the coil sensitivity matrix and the voxel deformation map. When performing SENSE imaging protocols the field of view for each of the multiple coil elements may be limited. This may result in so called folding artefacts. The inhomogeneities of the magnetic field may also cause distortions or shifts in the location of where a voxel is represented and where its true location is based relative to the other voxels. In extreme cases this may also result in folding like artefacts caused by the magnetic field. Calculating unfolding matrices that are modified using the voxel deformation map may enable the correction of these additional artefacts due to inhomogeneities in the magnetic field of the magnetic resonance imaging system.

Execution of the machine-executable instructions further cause the processor to calculate undistorted magnetic resonance image data using the set of folded magnetic resonance images and the set of unfolding matrices. The undistorted magnetic resonance image data is therefore magnetic resonance image data which has had the folding artefacts from the SENSE imaging protocol removed and also distortion or folding of the image due to magnetic field inhomogeneities. This embodiment may have the benefit of providing for magnetic resonance images where the image is distorted by both magnetic field distortions and also folding artifacts due to the use of a SENSE imaging protocol. The use of the voxel deformation map may be beneficial because the unfolding matrices will not be able to account for these corrections by themselves.

The undistorted magnetic resonance image data may take different forms in different examples. In some cases the undistorted magnetic resonance image data may be a slice of two-dimensional voxels and may represent a conventional image. In other cases the undistorted magnetic resonance image data may be a collection of two-dimensional slices or even three-dimensional image data which may then be rendered or displayed in different ways on a user interface or display.

In another embodiment, execution of the machine-executable instructions further cause the processor to calculate modified magnetic resonance image data by transforming the undistorted magnetic resonance image data with the voxel deformation map. In this step the undistorted magnetic resonance image data is re-distorted using the voxel deformation map. The undistorted magnetic resonance image data may for instance be a two-dimensional slice, a collection of two-dimensional slices, or even three-dimensional magnetic resonance image data. The calculation of the modified magnetic resonance image data may be beneficial in several cases.

In one case if there are severe folding like artifacts caused by the magnetic field distortions several points representing different true geometric locations may be compressed or mapped onto the same or similar or very close locations within the set of folded magnetic resonance images. When these points are split apart again there may be large amounts of noise in the regions of the undistorted magnetic resonance image data. By calculating the modified magnetic resonance image data these points are then combined again. The noise of locations relative to the signal is then reduced. It may also have the benefit when the magnetic resonance image is located near implants or other objects which may cause distortions of the magnetic field. This may be beneficial because physicians or other operators of the magnetic resonance imaging system may be accustomed to seeing particular image artefacts. In any case, the modified magnetic resonance image data may provide a superior image to a magnetic resonance image to which a conventional SENSE imaging protocol is applied when there are sufficient distortions in the magnetic field inhomogeneity.

The magnetic field distortions may also cause errors in calculating the coil sensitivities. The voxel deformation map may help to correct these. The calculated modified magnetic resonance image data may therefore be superior to magnetic resonance image data that is calculated using the SENSE imaging protocols when magnetic field inhomogeneities are present.

In another embodiment, the modified unfolding matrix is at least partially calculated by transforming the coil sensitivity matrix with the voxel deformation map. This may be beneficial because the voxel deformation map may be directly used to modify the coil sensitivity matrix.

In another embodiment, the modified unfolding matrix is calculated before reconstructing the folded magnetic resonance image. This may have the benefit of providing for faster image reconstruction once the magnetic resonance data is acquired.

In another embodiment, the SENSE imaging protocol is an echo planar imaging protocol. The echo planar imaging protocol is configured for acquiring magnetic resonance data with phase encoding in at least one phase encoding direction. For example if the magnetic resonance data is only acquired for a single slice there may be only one phase encoding direction within the slice. In other examples the second phase encoding direction may be used for encoding the different slices within a three-dimensional SENSE imaging protocol. The voxel deformation map is descriptive of a local magnetic field distortion in the at least one phase encoding direction. This may be beneficial because phase encoding is particularly sensitive to inhomogeneities in the magnetic field. The embodiment may provide for an effective means of correcting images for the SENSE imaging protocol that use echo planar imaging methods.

In another embodiment, the at least one phase encoding direction is two phase encoding directions. In some embodiments the two phase encoding directions may be orthogonal. The SENSE imaging protocol is a three-dimensional SENSE imaging protocol. One of the two orthogonal phase encoding directions is configured for slice selection. This embodiment may be beneficial because it may provide for a means of correcting for folding artifacts which are spread apart multiple slices.

In another embodiment, the SENSE imaging protocol is a simultaneous multiple slice acquisition imaging protocol. In a simultaneous multiple slice acquisition imaging protocol multiple slices are acquired at the same time. The use of the voxel deformation map to correct the unfolding matrices may provide for an improved means of separating data between the various slices correctly.

In another embodiment, the modified unfolding matrices are formulated in a feed-forward format. This may provide for a means of more rapidly performing the construction of the undistorted magnetic resonance image data.

In another embodiment, the modified unfolding matrix is at least partially calculated using a regularization term. For example, the ISMRM abstract by Fuderer et. al. describes a formulation of the SENSE reconstruction which uses a diagonal matrix R. The diagonal matrix R may be considered to be a regularization term. In several improved magnetic resonance imaging protocols the diagonal matrix R in Fuderer et. al. may be replaced by an alternative matrix which represents an estimate of tissue presence. In another embodiment, the regularization term is an estimate of the tissue presence modified by the voxel deformation map. Modifying of the regularization term by the voxel deformation map may provide for a SENSE reconstruction which is more accurate.

In another embodiment, execution of the machine-executable instructions further cause the processor to identify one or more high-noise regions in the undistorted magnetic resonance image by using the voxel deformation map to locate the high-noise regions within a predetermined distance of the image folding caused by magnetic field inhomogeneities. Within the images the high-noise regions could for example by highlighted or blacked out so as not to confuse a physician or other individual looking at the undistorted magnetic resonance data.

In another embodiment, the SENSE imaging protocol is a multi-shot SENSE imaging protocol. SENSE imaging protocols may be divided into so called single-shot SENSE imaging protocols and multi-shot SENSE imaging protocols. In a single-shot SENSE imaging protocol the data for an entire slice is acquired in a single shot or pulse repetition. Using the multi-shot SENSE imaging protocol may be beneficial when there are magnetic field inhomogeneities. For example if the phase encoding is used in the SENSE imaging protocol the distortion of the image is directly related to the temporal length of the pulse repetition. This is because as the phase error is related to the field of inhomogeneity times the time. By reducing the time the effect of the magnetic field inhomogeneities can be reduced. Combining this with the use of the modified unfolding matrices may provide for greatly reduced artifacts or errors caused by magnetic field inhomogeneities.

In another embodiment, the voxel deformation map is calculated using the pulse sequence commands and the magnetic field inhomogeneity map. For example various durations or parameters within the pulse sequence commands may be extracted and used to calculate the expected voxel deformation map. As was mentioned above, when phase encoding is used the expected phase error for a particular voxel can be directly calculated by noting the magnetic field inhomogeneity and also the duration of the pulse repetition. The pulse repetition is a parameter within the pulse sequence commands.

In another embodiment, execution of the machine-executable instructions further cause the processor to acquire preliminary magnetic resonance data using a coil sensitivity measuring magnetic resonance imaging protocol. Execution of the machine-executable instructions further causes the processor to calculate the coil sensitivity matrix using the preliminary magnetic resonance data. The coil sensitivity measuring magnetic resonance imaging protocol may be one of a variety of different imaging protocols which are used to determine the coil sensitivities of the various coil elements. In some systems a rough or low-resolution image may be acquired using a whole body coil in addition to the multiple coil elements. This may allow direct calculation of the coil sensitivities. In other examples the images from the various multiple coil elements are combined using an algorithm and then compared against images from various coil elements to calculate the coil sensitivities.

In another embodiment, execution of the machine-executable instructions further cause the processor to acquire magnetic field magnetic resonance data using a magnetic field measuring magnetic resonance imaging protocol. Execution of the machine-executable instructions further cause the processor to calculate the magnetic field inhomogeneity map using the magnetic field magnetic resonance data. This may be beneficial as various subjects placed within the magnetic resonance imaging system may have different magnetic field inhomogeneity maps associated with them. Measuring it directly for a particular subject may be beneficial.

There may be different methods of calculating the magnetic field measuring magnetic resonance imaging protocol. Examples of protocols which may work are for example a so called Dixon magnetic resonance imaging protocol. In Dixon magnetic resonance imaging water and fat images are separated by acquiring data at various phases. A result of this technique is that the magnetic field inhomogeneity can be calculated. Another example may be a so called tissue presence mapping protocol. The tissue presence mapping protocol may be used to estimate the location of tissue within an imaging zone of the magnetic resonance imaging system. An example of a technique which may work may also be used for measuring the coil sensitivities.

Another example of a method of measuring the magnetic field is a so called field echo magnetic resonance imaging protocol. These methods are phase sensitive magnetic resonance imaging protocols and may also be used to estimate the magnetic field inhomogeneities.

In another aspect, the invention provides for a computer program product comprising machine-executable instructions for execution by a processor controlling the magnetic resonance imaging system. The magnetic resonance imaging system comprises a radio-frequency system comprising multiple coil elements for acquiring magnetic resonance data. Execution of the machine-executable instructions causes the processor to control the magnetic resonance imaging system to acquire the magnetic resonance data using pulse sequence commands. The pulse sequence commands are configured for controlling the magnetic resonance imaging system to acquire magnetic resonance data according to a SENSE imaging protocol.

Execution of the machine-executable instructions further cause the processor to reconstruct a set of folded magnetic resonance images from the magnetic resonance data. Execution of the machine-executable instructions further cause the processor to calculate a voxel deformation map from a magnetic field inhomogeneity map. Execution of the machine-executable instructions further cause the processor to calculate a set of unfolding matrices using at least partially a coil sensitivity matrix for the multiple coil elements. The set of unfolding matrices comprises at least one modified unfolding matrix. The at least one modified unfolding matrix is calculated at least partially using the coil sensitivity matrix and the voxel deformation map.

Execution of the machine-executable instructions further cause the processor to calculate undistorted magnetic resonance image data using the set of folded magnetic resonance images and a set of unfolding matrices. The benefits of this computer program product have been previously discussed.

In another aspect, the invention provides for a method of imaging using a magnetic resonance imaging system. The magnetic resonance imaging system comprises a radio-frequency system comprising multiple coil elements for acquiring magnetic resonance data. The method comprises controlling the magnetic resonance imaging system to acquire the magnetic resonance data using pulse sequence commands. The pulse sequence commands are configured for controlling the magnetic resonance imaging system to acquire magnetic resonance data according to a SENSE imaging protocol. The method further comprises reconstructing a set of folded magnetic resonance images from the magnetic resonance data. The method further comprises calculating a voxel deformation map from a magnetic field inhomogeneity map. The method further comprises calculating a set of unfolding matrices using at least partially a coil sensitivity matrix for the multiple coil elements. The set of unfolding matrices comprises at least one modified unfolding matrix. The at least one modified unfolding matrix is calculated at least partially using the coil sensitivity matrix and the voxel deformation map. The method further comprises calculating undistorted magnetic resonance image data using a set of folded magnetic resonance images and a set of unfolding matrices.

It is understood that one or more of the aforementioned embodiments of the invention may be combined as long as the combined embodiments are not mutually exclusive.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage may be any volatile or non-volatile computer-readable storage medium.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the C programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further understood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, bluetooth connection, wireless local area network connection, TCP/IP connection, ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) display, Electroluminescent display (ELD), Plasma display panel (PDP), Liquid crystal display (LCD), Organic light-emitting diode display (OLED), a projector, and Head-mounted display.

Magnetic Resonance (MR) data is defined herein as being the recorded measurements of radio frequency signals emitted by atomic spins using the antenna of a magnetic resonance apparatus during a magnetic resonance imaging scan. Magnetic resonance data is an example of medical imaging data. A Magnetic Resonance (MR) image or magnetic resonance image data is defined herein as being the reconstructed two or three dimensional visualization of anatomic data contained within the magnetic resonance data.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

In MRI, particularly when using an Echo Planar Imaging (EPI) sequence, significant geometric distortions may occur due to local deviations of the magnetic field. This may be particularly seen close to metal implants or close to cavities, e.g. the ear or nose cavities—or, in general, with all tissue-to-air interfaces. In many cases, the distortion itself is clinically not very relevant nor disturbing.

However, when using SENSE, there may be indirect consequences of the distortion. At the 'folding position' relative to the distorted region (e.g. at a distance of half the field-of-view with SENSE_factor=2), artifacts may appear of the distorted region, even if that folding-position is rather free from distortion. This may for example result in artifacts in otherwise undistorted, and clinically relevant, regions. Examples may have the effect of reducing or eliminating artifacts in SENSE images that originate from regions of geometric distortions caused by magnetic field inhomogeneities.

Examples may have one or more of the following features:
1. When applying SENSE, the coil sensitivities are taken from the true geometric positions that contribute to a "folded point", as opposed to taking the coil-sensitivities from their nominal ("distorted") positions.
2. Due to the distortion, we may get a larger number of locations that contribute to a folded point than the nominal SENSE factor: in that case, a (locally) extended set of SENSE-equations is resolved.
3. After performing the SENSE reconstruction, the image may be re-distorted using the voxel deformation map to aide a physician in interpreting the image.

Figure 1:
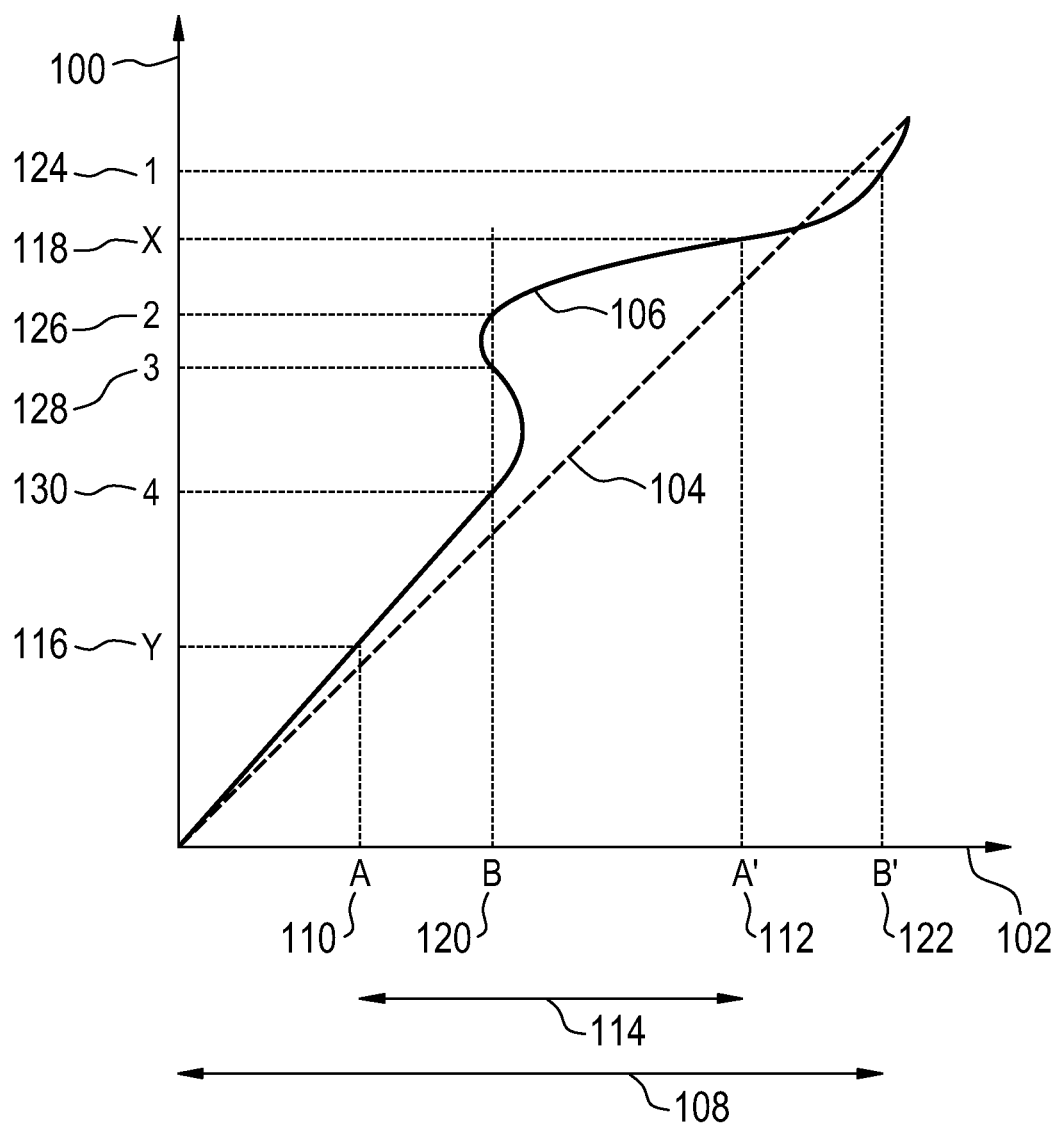
FIG. 1 illustrates a shift in voxel location due to magnetic field inhomogeneities.

FIG. 1 shows a plot of the true geometric location of a voxel versus the distorted or nominal location 102. FIG. 1 is used to illustrate the effects of folding caused by magnetic field inhomogeneities when performing a SENSE-type magnetic resonance imaging protocol. In FIG. 1 a SENSE factor of 2 is assumed. The diagonal line 104 shows the relationship between the true geometric location 102 and the distorted nominal location 102 if there were no effects due to magnetic field distortions. The curve 106 shows the actual geometric location 100 as a function of the distorted or nominal location 102. This can be seen as a curve which overlaps itself in the y or true geometric location 100. This results in a pseudo folding effect. With the SENSE factor of 2 some points are imaged more than once within the field of view.

The point a 110 and the point A' 112 correspond to folded points. The distance 114 is the folding distance. The points A 110 and A' 112 are projected onto the curve 106. This gives the true geometric location 100. Point a 110 is projected onto point y 116 and point A' 112 is projected onto point X 118. For A and A' 110 and 112 there is only one corresponding point 116 and 118. The field of view is represented by the line 108. Within the field of view 108 there is a second point B 120 that is mapped onto points 130, 128, and 126. The corresponding folded point B' 122 is mapped onto a single point one 124. The point B as it is mapped onto three different points cannot be corrected using a normal SENSE reconstruction. This however can be corrected using a voxel deformation map. If the curve 106 is discretized it may be interpreted as a voxel deformation map.

The folded pixel A 110, which (in a folded image) is identical to A' 112, has been contributed to by true geometric locations X 118 and Y 116. For this set of locations, a 'regular' SENSE set of two equations has to be solved. However, when considering folded pixel B 120 (identical to B' 122 in the folded image), there are actually four contributing locations in the true world: one 124, two 126, three 128 and four 130. This is resolved by a set of 'extended SENSE equations', i.e. having to resolve four unknowns rather than two, from as many equations as we have coil elements.

Yet, since some of the points (e.g. two 126 and three 128) are very close to each other, the SENSE-unfolding between these two will exhibit a very high level of noise amplification, since their coil sensitivities are rather similar. Yet, the sum of these two results will be of a 'normal' noise level.

So, to prevent excessive noisiness of some image areas, the result may be distorted according to the distortion that was present in the original acquisition (by using the voxel deformation map). E.g., the results of locations two 126, three 128 and four 130 are summed and mapped to location B, while the result of 1 is mapped to location B'. In this way, the end-result image is still geometrically distorted, but reconstructed pixel B' may now contain fewer SENSE-artifacts originating from regions two 126, three 128 and four 130.

Figure 2:
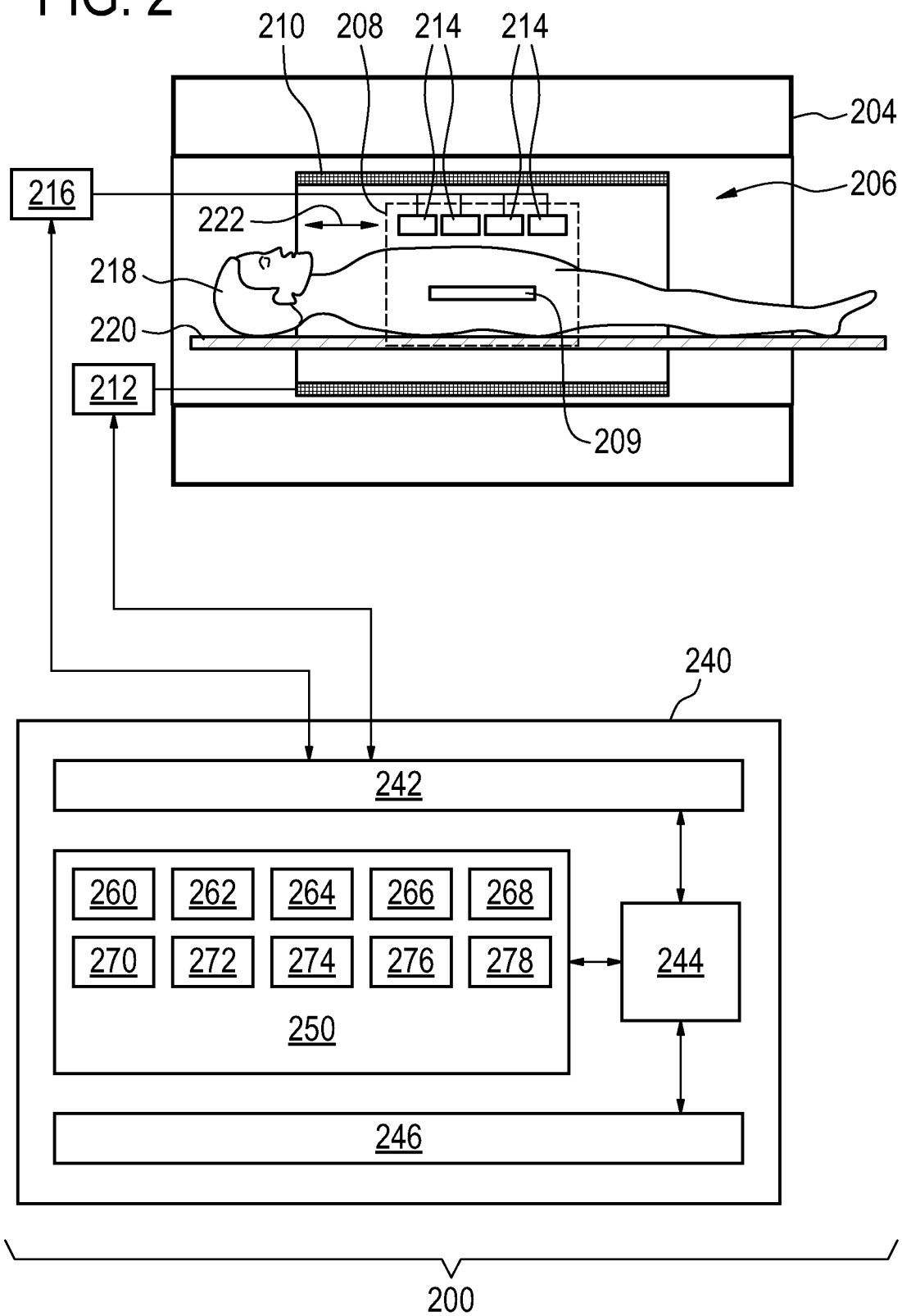
FIG. 2 illustrates an example of a magnetic resonance imaging system.

FIG. 2 illustrates an example of a magnetic resonance imaging system 200. The magnetic resonance imaging system 200 comprises a main magnet 204, which may be referred to as the magnet. The magnet 204 is a superconducting cylindrical type magnet 104 with a bore 206 through it. The use of different types of magnets is also possible. Inside the cryostat of the cylindrical magnet, there is a collection of superconducting coils. Within the bore 206 of the cylindrical magnet 204 there is an imaging zone 208 where the magnetic field is strong and uniform enough to perform magnetic resonance imaging.

Within the bore 206 of the magnet there is also a set of magnetic field gradient coils 210 which is used for acquisition of magnetic resonance data to spatially encode magnetic spins within the imaging zone 208 of the magnet 204. The magnetic field gradient coils 210 are connected to a magnetic field gradient coil power supply 212. The magnetic field gradient coils 210 are intended to be representative. Typically magnetic field gradient coils 210 contain three separate sets of coils for spatially encoding in three orthogonal spatial directions. A magnetic field gradient power supply supplies current to the magnetic field gradient coils.

The current supplied to the magnetic field gradient coils 210 is controlled as a function of time and may be ramped or pulsed.

Adjacent to the imaging zone 208 are multiple coil elements 214 that each function as radio-frequency antennas for manipulating the orientation of magnetic spins within the imaging zone 208 and for receiving radio transmissions from spins also within the imaging zone 208. The radio frequency coils may also be referred to as a radio frequency antennas or as antennas. The multiple coil elements may also be referred to as a antenna elements. The radio frequency antennas may also be referred to as channels. The multiple coil elements 114 are connected to a radio frequency transceiver 116. The multiple coil elements 114 and radio frequency transceiver 116 may have separate transmitters and receivers for each the multiple coil elements 214.

The coil elements 214 may be used to acquire magnetic resonance data separately. The coil elements 214 may therefore be used for a parallel imaging magnetic resonance technique. Although it is not shown in this Fig, the magnetic resonance imaging system 200 may also comprise a body coil. The body coil would be useful in the parallel imaging technique as it could take acquired data at the same time as the individual coil elements 214 and be used for calculating a set of coil sensitivities.

The magnetic resonance data may be acquired from within the imaging zone 208. The location of a slice 209 is visible within the imaging zone 208. The pulse sequence commands for acquiring the magnetic resonance data may in some examples be done with phase encoding in a phase encoding direction 222. The arrow 222 indicates one possible direction that is parallel or coplanar with the slice 209. If phase encoding in the direction 222 is used the resulting image may be susceptible to distortions in the main magnetic field produced by the magnet 204.

It can be seen that different coil elements 214 are different distances from different regions of the slice 209. Different coil elements 214 will therefore be more or less sensitive to various portions of the slice 209.

Within the bore 206 of the magnet 204 there is a subject support 220 which supports the subject in the the imaging zone 208.

The transceiver 216 and the gradient controller 230 are shown as being connected to a hardware interface 242 of a computer system 240. The computer system further comprises a processor 244 that is in communication with the hardware system 242, memory 250, and a user interface 246. The memory 250 may be any combination of memory which is accessible to the processor 244. This may include such things as main memory, cached memory, and also non-volatile memory such as flash RAM, hard drives, or other storage devices. In some examples the memory 250 may be considered to be a non-transitory computer-readable medium.

The computer memory 250 is shown as containing machine-executable instructions 260 which enable the processor 244 to control the operation and function of the magnetic resonance imaging system 200. The computer memory 250 is further shown as containing pulse sequence commands 262 which are configured for acquiring magnetic resonance data according to a SENSE imaging protocol. The computer memory 250 is further shown as containing magnetic resonance data 264 that was acquired by controlling the magnetic resonance imaging system 200 with the pulse sequence commands 262. The magnetic resonance data 264 contains data that was acquired from each of the coil elements 215 separately. The computer memory 250 is further shown as containing a set of folded magnetic resonance images 266. Each of the folded magnetic resonance images corresponds to one of the coil elements 215. Each of the folded magnetic resonance images 266 was reconstructed from the various portions of the magnetic resonance data 264 acquired for each of the coil elements 215.

The computer memory 250 is further shown as containing a magnetic field inhomogeneity map 268. The magnetic field inhomogeneity map 268 could be pre-existing in the memory 250 or it could be acquired and calculated prior to acquiring the magnetic resonance data 264. The computer memory 250 is further shown as containing a voxel deformation map 270 that was calculated from the magnetic field inhomogeneity map 268. In many cases the voxel deformation map 270 will be calculated using the magnetic field inhomogeneity map 268 and data extracted from the pulse sequence commands 262. For example if the pulse sequence commands 262 are for an echo planar imaging protocol where there is phase encoding in the phase encoding direction 222 then the amount of phase error in the acquired magnetic resonance data is directly related to the pulse repetition time and the local magnetic field inhomogeneities.

The computer memory 250 is further shown as containing a set of coil sensitivities 272 for the coil elements 215. The set of coil sensitivities 272 could for example be pre-stored or could have been acquired during a pre-acquisition prior to acquiring the magnetic resonance data 264. The computer memory 250 is further shown as containing a set of unfolding matrices 274 which are calculated from the set of coil sensitivities 272 and the voxel deformation map 270. The set of unfolding matrices 274 is used to combine the set of folded magnetic resonance images 268 into an undistorted magnetic resonance image data 276. In this particular example, the magnetic resonance data is acquired for a single slice 209.

The undistorted magnetic resonance image data 276 may in this case represent a two-dimensional image. The computer memory 250 is shown as containing optionally the modified magnetic resonance image data 278 which is calculated by applying the voxel deformation map 270 to the undistorted magnetic resonance image data 276. This creates a re-distorted but unfolded magnetic resonance image or dataset.

Figure 3:
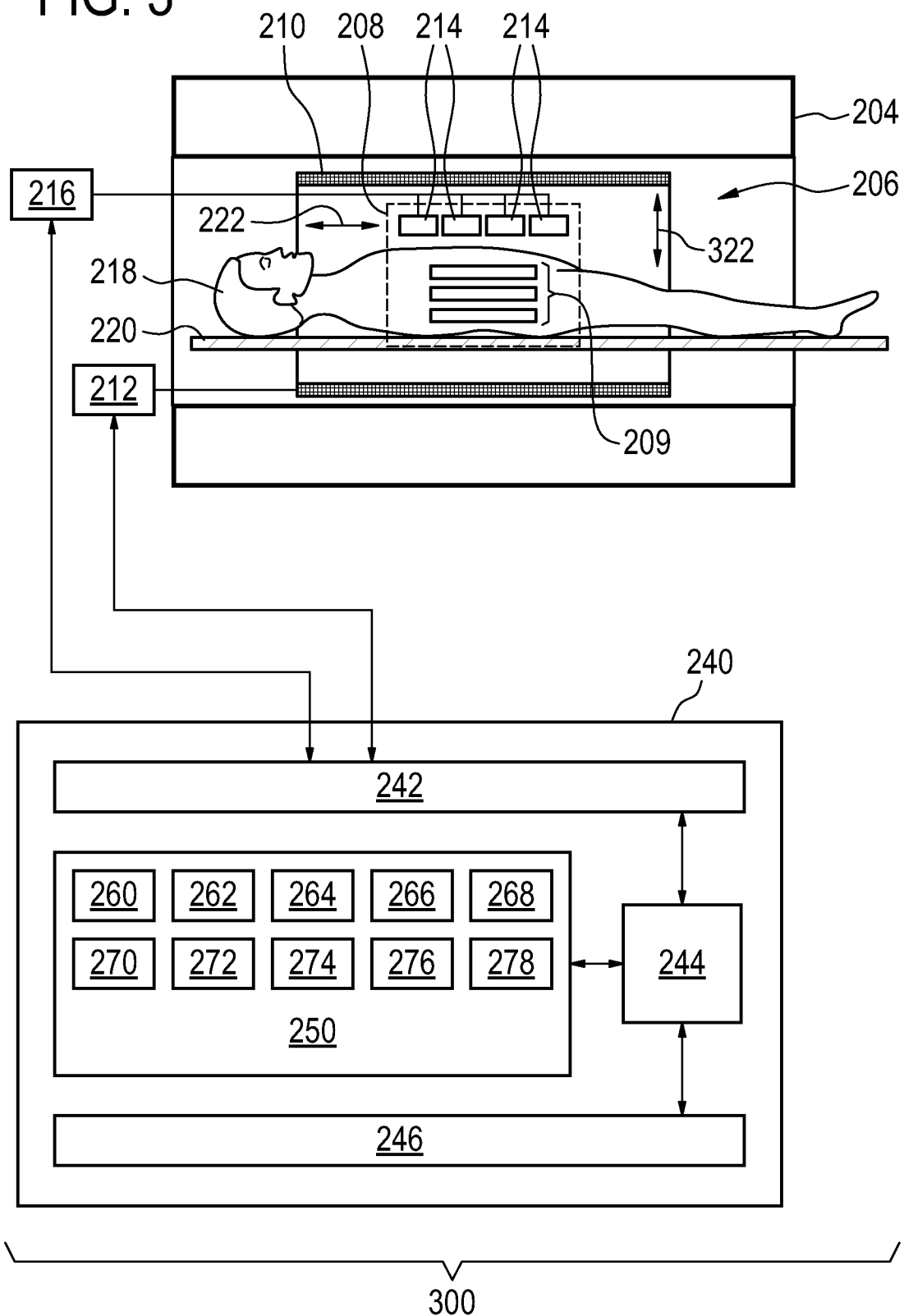
FIG. 3 illustrates a further example of a magnetic resonance imaging system.

FIG. 3 shows an example of a magnetic resonance imaging system 300. The magnetic resonance imaging system 300 is similar to the magnetic resonance imaging system 200 illustrated in FIG. 2. However in this case, the pulse sequence commands 262 are different. In this example the magnetic resonance data is acquired as a three-dimensional acquisition. Instead of a single slice there are a set of voxels 209 which may be divided into multiple slices 209. In addition to the phase encoding direction 222 there is another direction 322 which is orthogonal to direction 222. This additional phase encoding direction 322 is used to differentiate between the different slices 209. Both the phase encoding direction 222 and 322 would be susceptible to distortions due to magnetic field inhomogeneities. In this example the voxel deformation map 270 is used to correct voxel positions for the acquired three-dimensional dataset.

Figure 4:
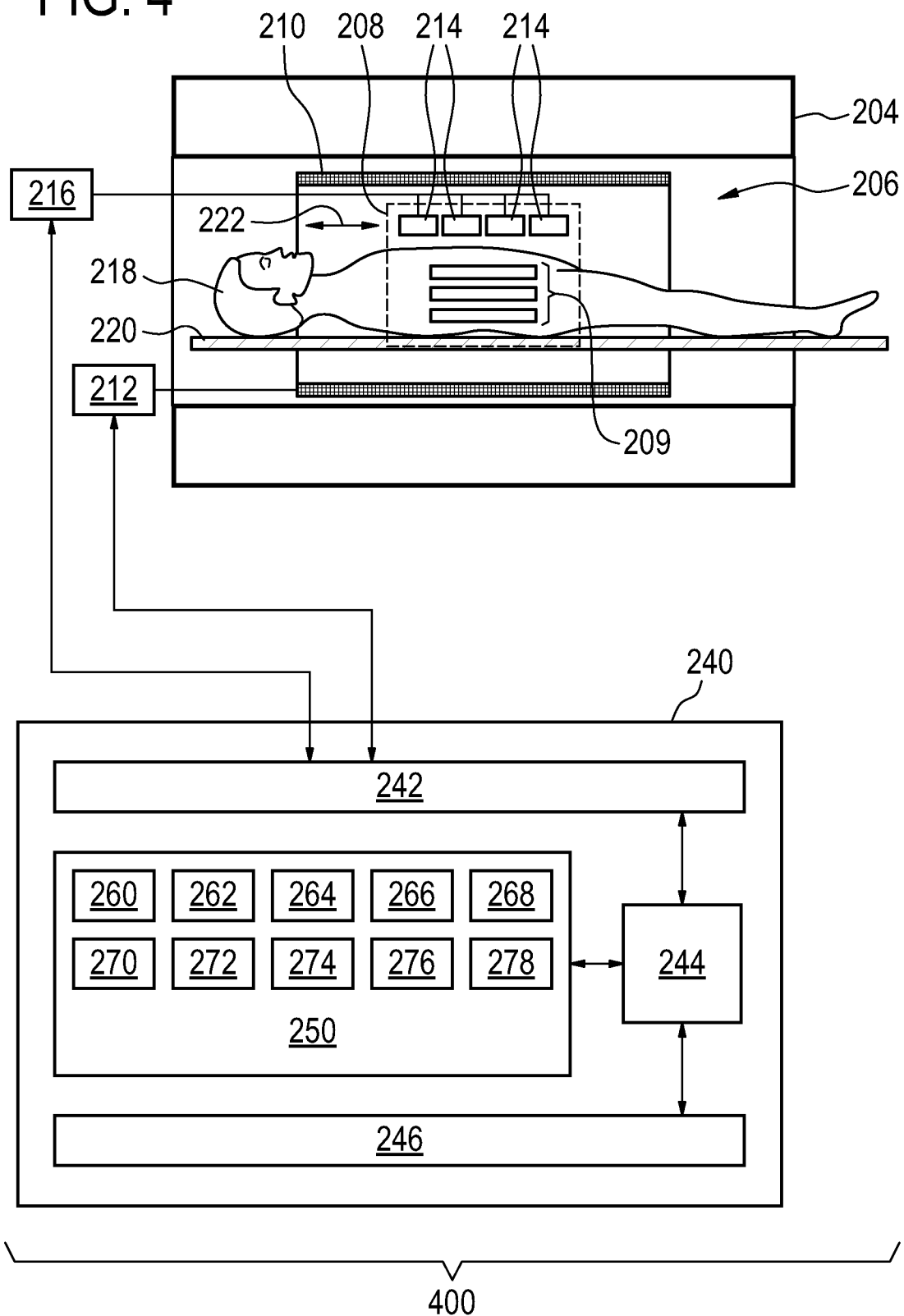
FIG. 4 illustrates a further example of a magnetic resonance imaging system.

FIG. 4 illustrates a further example of magnetic resonance imaging system 400. The example shown in FIG. 4 is similar to the examples illustrated in both FIGS. 2 and 3. In the example shown in FIG. 4 the pulse sequence commands 262 are for a SENSE imaging protocol that is a simultaneous multiple slice acquisition imaging protocol. The individual slices 209 are acquired simultaneously but are not acquired with phase encoding as is performed in FIG. 3. The SENSE imaging protocol methodology is used to separate the simultaneously acquired data into distinct slices. The set of coil sensitivities 272 calculated using the voxel deformation map 270 is useful in correctly separating data into the proper slices 209.

Figure 5:
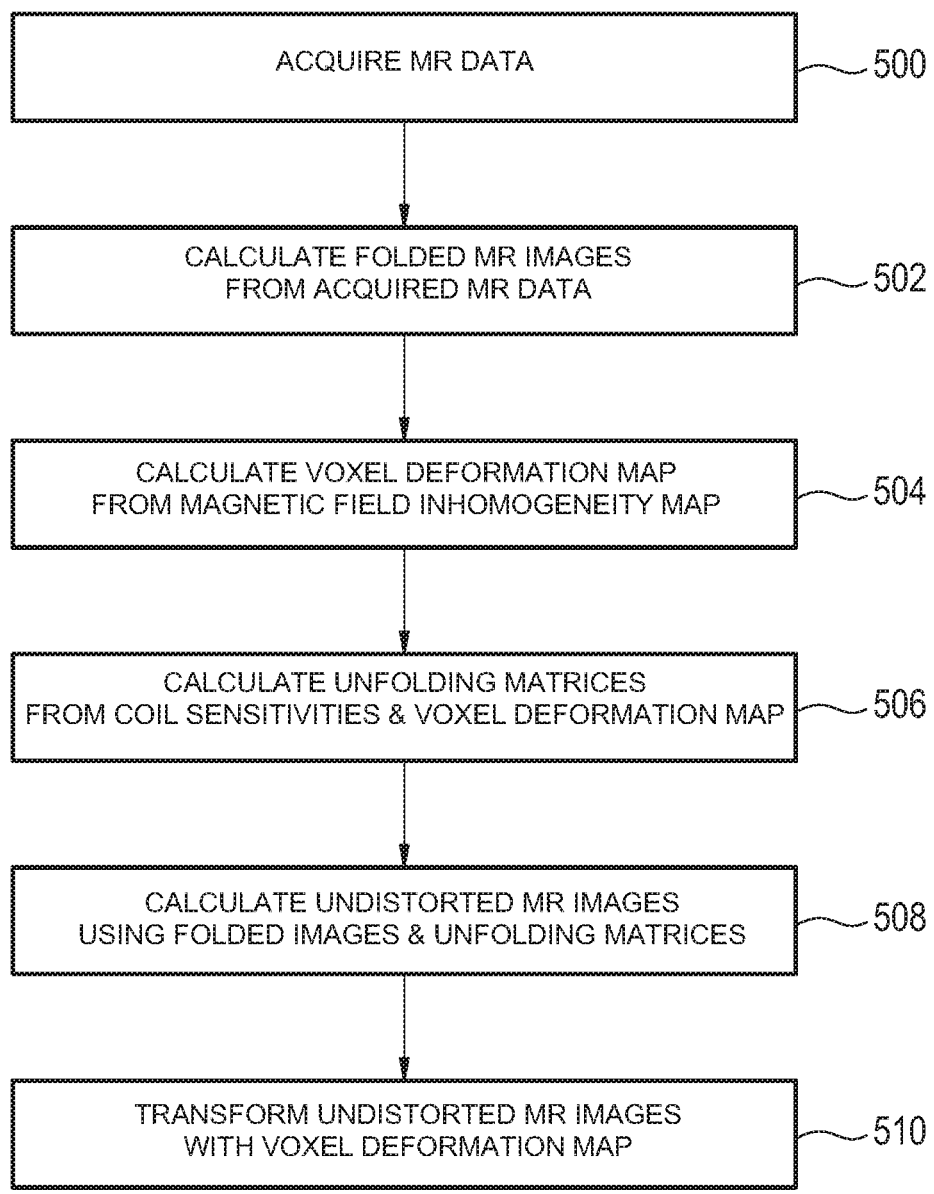
FIG. 5 illustrates a method of using the magnetic resonance imaging system of FIG. 2, 3 or 4.

FIG. 5 shows a flowchart, which illustrates a method of operating the magnetic resonance imaging systems 200, 300, or 400. First in step 500 the magnetic resonance imaging system 200, 300, 400 is controlled to acquire the magnetic resonance data 264 using the pulse sequence commands 262. Next in step 502 the set of folded magnetic resonance images 266 is calculated for each of the coil elements 215 from the acquired magnetic resonance data 264. Next in step 504 the voxel deformation map 270 is calculated from the magnetic field inhomogeneity map 268. Then in step 506 the set of unfolding matrices 274 is calculated using the set of coil sensitivities 272 and for some of the unfolding matrices the voxel deformation map 270 is also used. Next in step 508 the undistorted magnetic resonance image data 276 is calculated 508 using the set of folded magnetic resonance images 266 and the set of unfolding matrices 274. Step 510 is an optional step where a modified magnetic resonance image data 278 is calculated by transforming the undistorted magnetic resonance image data 276 with the voxel deformation map 270.

Examples may take the deformations due to local B0 variations into account during the unfolding of individual coil elements. In the below example an EPI scan is discussed, however the technique may also be applicable to other types of SENSE image reconstructions.

In one example a B0 map may be acquired as a prescan to the EPI scan. The shift at a pixel p, $\Delta_p$ (in reconstructed pixels) is directly related to the variation in B0 at p, $\Delta B0_p$ (in Hertz) according to:

$$\Delta_p = \frac{\Delta B0_p \cdot N_{pe}}{BW_{pe} \cdot R_{pe}}$$

Where (in phase encoding direction) $BW_{pe}$ is the acquisition bandwidth, in Hertz per folded FOV, $N_{pe}$ the unfolded grid size and Rpe the in-plane sense factor.

The B0 deformation discussed here is a deformation on top of deformations due to gradient non-linearities. It is assumed both the CSM and the clinical scan are affected to the same amount by gradient imperfections.

For a phase encoding line a deformation matrix (also referred to as a voxel deformation map) can be derived which maps undeformed coordinates to deformed or vice versa. A deformation matrix maps every undeformed point to a deformed point. The deformation matrix is a discrete representation (at unfolded grid size) where every undeformed point maps to 1 or more deformed points. The deformation between two successive points is interpolated linear such that a continuous trace of non-zero matrix elements is created.

To ensure that a mapping from deformed to undeformed exists for every deformed point, the deformation at begin and end of each Y-line is set to 0, i.e. no deformation. In practice this is already zero if the anatomy is completely included in the FOV and/or if sufficient intrinsic fold-over suppression is applied.

In case there are regions where the B0 map does not completely cover the unfolded FOV, deformations in some examples are assumed to be zero in those regions.

Figure 6:
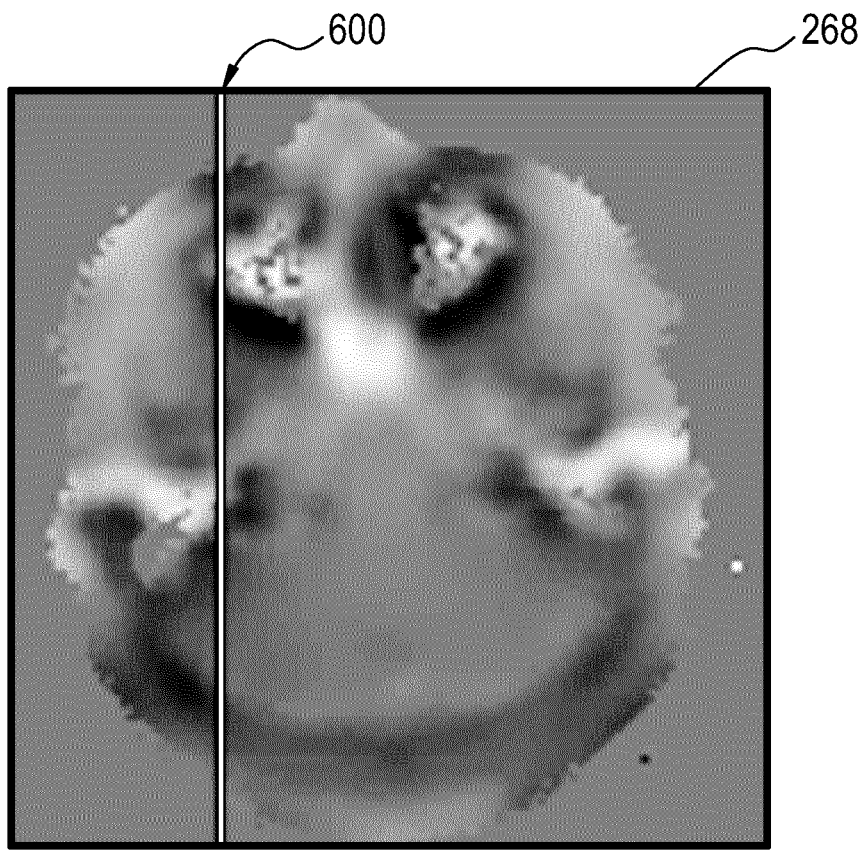
FIG. 6 shows a plot of a map of the B0 magnetic field in a magnetic resonance imaging system.

FIG. 6 illustrates an example of a magnetic field inhomogeneity map 268. In this example the magnetic field inhomogeneity map is a mapping of the spatial dependence of the main magnetic field, which is also referred to as the B0 field. The line 600 indicates where a portion of this data is extracted and used to calculate a voxel deformation map 270. The line 600 from the B0 map (268) from which a deformation matrix (below) can be derived.

Figure 7:
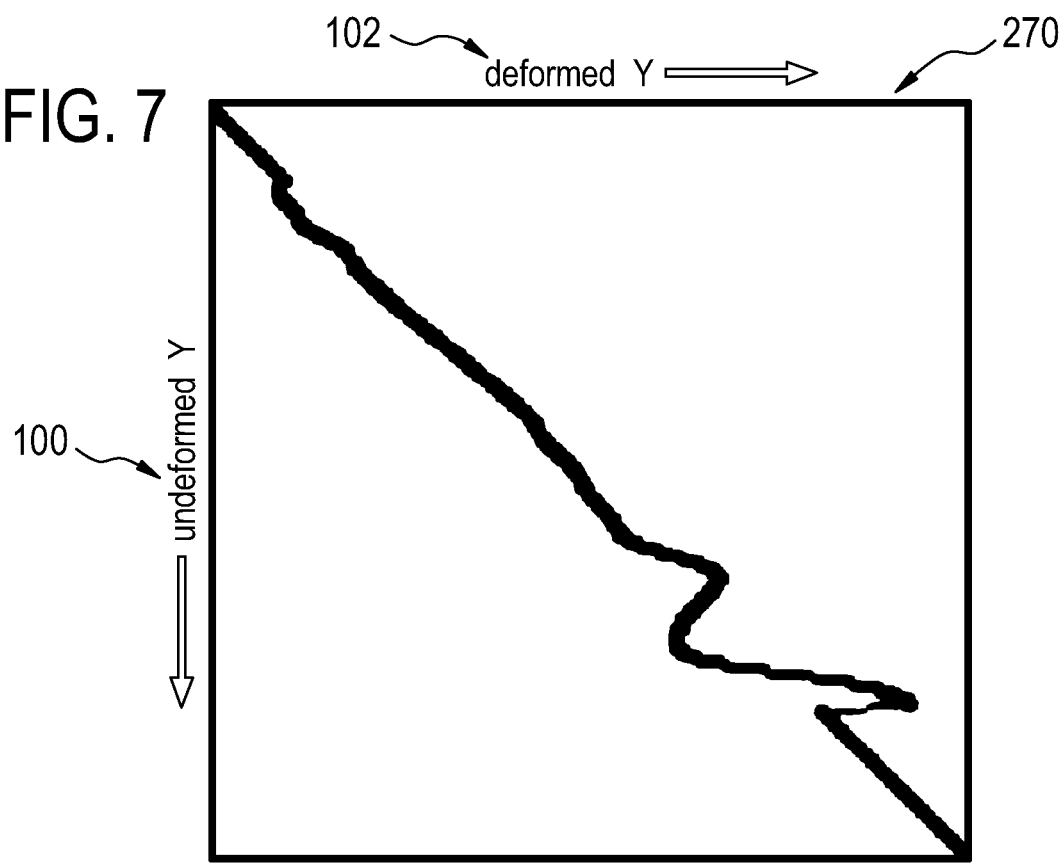
FIG. 7 shows an example of voxel deformation map calculated using the Map of the B0 magnetic field of FIG. 6.

FIG. 7 illustrates the voxel deformation map 270 (also referred to as deformation matrix herein) calculated for the data extracted along line 600 in FIG. 6. The plot in FIG. 7 resembles the plot in FIG. 1, however in FIG. 7 the mapping 270 is for discreet voxels.

In an SENSE acquisition, a realistic model of the measured magnetic resonance data can be written as:

$$m_i(\vec{x}) = \sum_j \sum_{y_u} w(y(\vec{x_j}(\vec{x})), y_u; x(\vec{x_j}(\vec{x})), z(\vec{x_j}(\vec{x}))) s_i(\vec{x_{u,j}}) p(\vec{x_{u,j}})$$

Glossary on how to read this:
$\vec{x}$ The coordinate vector of a folded and deformed voxel.
$m_i(\vec{x})$ The value 'seen' by coil element i on location $\vec{x}$.
j Index to the points that fold onto voxel $\vec{x}$; j=1 . . . N, where N is the total SENSE factor.
$\vec{x_j}(\vec{x})$ The coordinates of the j-th of the points that fold onto folded location $\vec{x}$.
$y(\vec{x_j}(\vec{x}))$ The y-coordinate of the vector $\vec{x_j}$. Similarly for $x(\vec{x_j}(\vec{x}))$ and $z(\vec{x_j}(\vec{x}))$.
$y_u$ Undeformed coordinate y.
$\Sigma y_u$ Summation over all the undeformed points that (may) contribute to a deformed point.
w(y, $y_u$; x, z) For a given value of x and z, w(y,yu) is the deformation map, explained in the sequel.
$\vec{x_{u,J}}$ "Undeformed folding point": shorthand for $(x(\vec{x_j}(\vec{x}))$, $y_u$, $z(\vec{x_j}(x)))$, i.e. a location that contributes (by a weight w) to the deformed point $\vec{x_j}(\vec{x})$.
$s_i(\vec{x_{u,j}})$ The sensitivity of coil i to an undeformed point that contributes to the deformed point that is the j-th point that folds onto position $\vec{x}$.
$p(\vec{x_{u,j}})$ The actual value of magnetization density at that undeformed point
In a somewhat shorter form, this is written as:
for each $\vec{x}$: $m_i = \Sigma_j \Sigma y_u w(y_j, y_u) s_i(y_u) p(y_u)$
So—per unfolded point, $y_u$ sums over the undeformed points. The contribution of the undeformed points to a deformed point y is the deformation map, denoted by w(y, $y_u$; x, z), or shorthand w(y,$y_u$).

Note the measurements $m_i(\vec{x})$ are deformed, while the sensitivity $s_i$ and the unknown pixel value p are undeformed. The contributions w(y,$y_u$) are retrieved from the deformation transformation. A single deformed point will likely map to a limited number of undeformed points, i.e. most of the contributions will be zero. In case the B0 map is 0 everywhere, the deformation matrix becomes the unit transform, and the modified SENSE equation reduces to the normal SENSE equation.

This sparsity allows to define "an undeformed sensitivity matrix" SU (and similarly RU). For this, we define, for each value of $\vec{x}$, the range k=1, . . . , M, where M is the total number of points that substantially contribute to $\vec{x}$ (via deformation and via folding). M is likely to be (somewhat) larger than the SENSE factor N.

The elements of the matrix SU are written (in shorthand notation) as $$s_{ik}^U = \sum_j w(y_j, y_k) s_i(y_k)$$

And, equivalently, $$r_{kk}^U = \left\| \sum_j w(y_j, y_k) r(y_k) \right\|^2$$

Solving the SENSE equation similar as discussed in the previous paragraph 6.1, in matrix notation, gives:

$$p = (S^{UH} S^U + (R^U)^{-1})^{-1} S^{UH} m = Cm$$

Here, vector p is expressed in undeformed coordinates. It contains M elements. In full notation, we should actually write $p(\vec{x})$, i.e. the set of (undeformed and unfolded) locations that correspond to the folded location $\vec{x}$.

In theory, we now have the issue that some elements of $p(\vec{x})$ might be the same location(s) as elements of a vector p pertaining to another folded point. Yet, this is resolved with the operation explained below.

For each folded location $\vec{x}$, undeformed points are transformed back to a deformed pixel:

$$p_{d,j} = \sum_k w(y_j, y_k) p_k$$

In words: "the j-th element of the 'normal' (i.e. deformed) vector pertains to the deformed location yj, is assembled from the elements of the undeformed vector p (whereby the k-th element has value $p_k$ and pertains to the undeformed location $y_k$), using the weights of the deformation map".

The rationale: in case of signal pile-up a single high-intensity measurement will unfold to several undeformed points. As these points are close to each other, there will be little discrimination between the CSM values, resulting in low SNR in the elements of p. This step allows to recover from that SNR loss.

There can be imperfections in the B0 map, there might be motion between the B0 prescan and the EPI scan, and also additional distortions in the EPI scan itself (e.g. due to Eddy currents). Robustness against artifacts stemming from these imperfections may be increased by shifting the deformation matrix over its diagonal and applying a pixelwise MAX operation on the original deformation matrix and the shifted one. This can be repeated multiple times while shifting in the positive and the negative direction.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 true geometric location
102 distorted (nominal) location
104 diagonal line
106 geometric location as a function of distorted locations
108 field of view
110 point A
112 point A'
114 folding distance
116 point Y
118 point X
120 point B
122 point B'
124 point one
126 point two
128 point three
130 point four
200 magnetic resonance system
204 main magnet
206 bore of magnet
208 imaging zone
209 slice
210 magnetic field gradient coils
212 gradient coil power supply
214 coil element
216 transceiver
218 subject
220 subject support
224 phase encoding direction
240 computer system
242 hardware interface
244 processor
246 user interface
250 computer memory
260 machine executable instructions
262 pulse sequence commands
264 magnetic resonance data
266 set of folded magnetic resonance images
268 magnetic field inhomogeneity map
270 voxel deformation map
272 set of coil sensitivities or coil sensitivity matrix
274 set of unfolding matrices
276 undistorted magnetic resonance image data
278 modified magnetic resonance image data
300 magnetic resonance imaging system
322 phase encoding direction
400 magnetic resonance imaging system 500 control the magnetic resonance imaging system to acquire the magnetic resonance data using the pulse sequence commands;
502 reconstruct a set of folded magnetic resonance images from the magnetic resonance data
504 calculate a voxel deformation map from a magnetic field inhomogeneity map
506 calculate a set of unfolding matrices using a least partially a coil sensitivity matrix for the multiple coil elements and the set of unfolding matrices comprises at least one modified unfolding matrix
508 calculate undistorted magnetic resonance image data using the set of folded magnetic resonance images and the set of unfolding matrices
510 calculate modified magnetic resonance image data by transforming the undistorted magnetic resonance image data with the voxel deformation map
600 line

The invention claimed is:

1. A magnetic resonance imaging system comprising:
a radio-frequency system comprising multiple coil elements for acquiring magnetic resonance data;
a non-transitory computer readable memory configured to store machine executable instructions and pulse sequence commands, wherein the pulse sequence commands are configured for controlling the magnetic resonance imaging system to acquire the magnetic resonance data according to a SENSE imaging protocol that is associated with folding effects due to under sampling in k-space of the magnetic resonance data,
a processor for controlling the magnetic resonance imaging system, wherein execution of the machine executable instructions causes the processor to:
control the magnetic resonance imaging system to acquire the magnetic resonance data using the pulse sequence commands;
reconstruct a set of folded magnetic resonance images from the magnetic resonance data;
calculate a voxel deformation map from a magnetic field inhomogeneity map;
calculate a set of unfolding matrices using at least partially a coil sensitivity matrix for the multiple coil elements, wherein the set of unfolding matrices comprises at least one modified unfolding matrix, wherein the at least one modified unfolding matrix is calculated using the coil sensitivity matrix and the voxel deformation map;
wherein the at least one modified unfolding matrix corrects folding-like artifacts due to inhomogeneities in the magnetic field;
calculate undistorted magnetic resonance image data using the set of folded magnetic resonance images and the set of unfolding matrices including the at least one modified unfolding matrix; and
calculate modified magnetic resonance image data by transforming the undistorted magnetic resonance image data with the voxel deformation map to incorporate the magnetic field inhomogeneity back into the undistorted magnetic resonance image data.

2. The magnetic resonance imaging system of claim 1, further including a display device configured to selectively display an undistorted image and an image with the magnetic field homogeneity incorporated back in.

3. The magnetic resonance imaging system of claim 1, wherein calculating the modified unfolding matrix includes transforming the coil sensitivity matrix with the voxel deformation map.

4. The magnetic resonance imaging system of claim 1, wherein the SENSE imaging protocol is an echo planar imaging protocol, wherein the echo planar imaging protocol is configured for acquiring magnetic resonance data with phase encoding in at least one phase encoding direction, wherein the voxel deformation map is descriptive of a local magnetic field distortion in the at least one phase encoding direction.

5. The magnetic resonance imaging system of claim 1, wherein the at least one phase encoding direction is two phase encoding directions, wherein the SENSE imaging protocol is a three-dimensional SENSE imaging protocol, wherein one of the two orthogonal phase encoding directions is configured for slice selection.

6. The magnetic resonance imaging system of claim 1, wherein the SENSE imaging protocol is a simultaneous multiple slice acquisition imaging protocol.

7. The magnetic resonance imaging system of claim 1, wherein the modified unfolding matrix is formulated in a feed forward format.

8. The magnetic resonance imaging system of claim 7, wherein the modified unfolding matrix is at least partially calculated using a regularization term.

9. The magnetic resonance imaging system of claim 1, wherein the SENSE imaging protocol is a multi-shot SENSE imaging protocol.

10. The magnetic resonance imaging system of claim 1, wherein the voxel deformation map is calculated using the pulse sequence commands and the magnetic field inhomogeneity map.

11. The magnetic resonance imaging system of claim 1, wherein execution of the machine executable instructions further causes the processor to:
acquiring preliminary magnetic resonance data using a coil sensitivity measuring magnetic resonance imaging protocol; and
calculate the coil sensitivity matrix using the preliminary magnetic resonance data.

12. The magnetic resonance imaging system of claim 1, wherein execution of the machine executable instructions further cause the processor to:
acquiring magnetic field magnetic resonance data using a magnetic field measuring magnetic resonance imaging protocol; and
calculate the magnetic field inhomogeneity map using the magnetic field magnetic resonance data.

13. A computer program product comprising:
machine executable instructions stored on a non-transitory computer readable medium for execution by a processor for controlling a magnetic resonance imaging system, wherein the magnetic resonance imaging system comprises a radio-frequency system comprising multiple coil elements acquiring magnetic resonance data, to control the magnetic resonance imaging system to perform the method comprising:
controlling the magnetic resonance imaging system to acquire the magnetic resonance data using pulse sequence commands, wherein the pulse sequence commands are configured for controlling the magnetic resonance imaging system to acquire the magnetic resonance data according to a SENSE imaging protocol that is associated with folding artifacts due to under sampling in k-space of the magnetic resonance data due to magnetic field inhomogeneities;
reconstructing a set of folded magnetic resonance images from the magnetic resonance data;

calculating a voxel deformation map from a magnetic field inhomogeneity map;

calculating at least one unfolding matrix using a coil sensitivity matrix for the multiple coil elements;

calculating at least one modified unfolding matrix using the coil sensitivity matrix and the voxel deformation map to correct for the folding artifacts due to inhomogeneities in the magnetic field;

calculating undistorted magnetic resonance image data using the folded magnetic resonance images, the at least one unfolding matrix, and the at least one modified unfolding matrix;

controlling a display to selectively display an image corrected for folding artifacts attributable to the magnetic field inhomogeneities as well as the under sampling in k-space and an image incorporating the magnetic field inhomogeneity; and calculating modified magnetic resonance image data by transforming the undistorted magnetic resonance image data with the voxel deformation map to incorporate the magnetic field inhomogeneity back into the undistorted magnetic resonance image data.

14. A method of magnetic resonance imaging using a magnetic resonance imaging system including a radio-frequency system with multiple coil elements for acquiring magnetic resonance data, the method comprising:

controlling the magnetic resonance imaging system to acquire the magnetic resonance data using pulse sequence commands, wherein the pulse sequence commands are configured for controlling the magnetic resonance imaging system to acquire the magnetic resonance data according to a SENSE imaging protocol that is associated with folding artifacts due to under sampling in k-space of the magnetic resonance data due to magnetic field inhomogeneities;

reconstructing a set of folded magnetic resonance images from the magnetic resonance data;

calculating a voxel deformation map from a magnetic field inhomogeneity map;

calculating at least one unfolding matrix using a coil sensitivity matrix for the multiple coil elements;

calculating at least one modified unfolding matrix using the coil sensitivity matrix and the voxel deformation map to correct for the folding artifacts due to inhomogeneities in the magnetic field;

calculating undistorted magnetic resonance image data using the folded magnetic resonance images, the at least one unfolding matrix, and the at least one modified unfolding matrix;

controlling a display to selectively display an image corrected for folding artifacts attributable to the magnetic field inhomogeneities as well as the under sampling in k-space and an image incorporating the magnetic field inhomogeneity; and calculating modified magnetic resonance image data by transforming the undistorted magnetic resonance image data with the voxel deformation map to incorporate the magnetic field inhomogeneity back into the undistorted magnetic resonance image data.

* * * * *